(12) United States Patent
Lee et al.

(10) Patent No.: US 10,838,465 B2
(45) Date of Patent: Nov. 17, 2020

(54) ELECTRONIC APPARATUS SHELL COVER

(71) Applicants: Micro-Star Int'l Co., Limited., New Taipei (TW); MSI Electronic (Kun Shan) Co., Ltd., Kunshan (CN)

(72) Inventors: Chung-Bi Lee, New Taipei (TW); Ming-Kan Chang, New Taipei (TW); Guo-Chen Hsieh, New Taipei (TW); Jia-Jun Hong, New Taipei (TW)

(73) Assignees: MICRO-STAR INT'L CO., LIMITED., New Taipei (TW); MSI ELECTRONIC (KUN SHAN) CO., LTD., Kunshan (CN)

( * ) Notice: Subject to any disclaimer, the term of this patent is extended or adjusted under 35 U.S.C. 154(b) by 0 days.

(21) Appl. No.: 16/420,665

(22) Filed: May 23, 2019

(65) Prior Publication Data

US 2020/0285283 A1 Sep. 10, 2020

(30) Foreign Application Priority Data

Mar. 6, 2019 (TW) .............................. 108202700 U

(51) Int. Cl.
*G06F 1/16* (2006.01)
*G06F 1/20* (2006.01)
(Continued)

(52) U.S. Cl.
CPC ............ *G06F 1/1656* (2013.01); *G06F 1/203* (2013.01); *H05K 5/0217* (2013.01); *H05K 5/03* (2013.01); *H05K 7/20181* (2013.01)

(58) Field of Classification Search
CPC ...... H05K 5/02; H05K 5/0213; H05K 5/0217; H05K 5/0239; H05K 5/03; H05K 7/20;
(Continued)

(56) References Cited

U.S. PATENT DOCUMENTS 6,828,500 B2 * 12/2004 Wagner ................ H05K 5/0213
174/17 R
9,681,564 B2 * 6/2017 Lin ..................... H05K 7/20127
(Continued)

FOREIGN PATENT DOCUMENTS

WO WO-0223965 A2 * 3/2002 ........... H05K 5/0213

*Primary Examiner* — Andrew M Roersma
(74) *Attorney, Agent, or Firm* — Muncy, Geissler, Olds and Lowe, P.C.

(57) ABSTRACT

An electronic apparatus shell cover includes a body, a dust blocking screen, and a plurality of structural ribs. The body includes an opening and a plurality of assembling grooves. The opening penetrates through the body. The assembling grooves are on a second surface of the body and adjacent to the opening. The dust blocking screen includes a screen surface and a plurality of assembling parts. The screen surface is mounted in the opening and coplanar with a first surface of the body. The assembling parts are disposed in the assembling grooves. The structural ribs are connected to the first surface of the body and on the dust blocking screen. The dust blocking screen is coplanar with the first surface, and the internal accommodating space of the electronic apparatus shell cover is increased. Furthermore, the structural ribs can increase mechanical strength of the shell cover, can enhance heat exchange efficiency.

10 Claims, 5 Drawing Sheets

(51) Int. Cl.
*H05K 5/02* (2006.01)
*H05K 5/03* (2006.01)
*H05K 7/20* (2006.01)

(58) Field of Classification Search
CPC ... H05K 7/20181; G06F 1/1656; G06F 1/181; G06F 1/182; G06F 1/203
See application file for complete search history.

(56) References Cited

U.S. PATENT DOCUMENTS

2007/0165379 A1* 7/2007 Chang ................ H05K 7/20181
361/695
2016/0044832 A1* 2/2016 Lewis ................ H05K 7/20172
454/184

* cited by examiner

ELECTRONIC APPARATUS SHELL COVER

CROSS-REFERENCE TO RELATED APPLICATION

This non-provisional application claims priority under 35 U.S.C. § 119(a) to Patent Application No. 108202700 in Taiwan, R.O.C. on Mar. 6, 2019, the entire contents of which are hereby incorporated by reference.

BACKGROUND

Technical Field

The present invention relates to a field of electronic apparatuses, and in particular, to an electronic apparatus shell cover.

Related Art

With computing demand of electronic apparatuses, a user expects that a computing speed of an electronic apparatus may be enhanced. Therefore, electronic elements required in an electronic apparatus are increased, or a computing unit density (for example, transistor) in a same electronic element is increased, and operating voltage and frequency of the electronic element becomes higher. However, relatively, the user also expects that an electronic apparatus is light, thin, short, and small in appearance, to be carried conveniently.

Therefore, there is a problem in design that an internal space of an electronic apparatus is reduced but heat sources generated by the electronic elements are increased. If heat from the heat sources cannot be dissipated, heat dissipation effects of the electronic apparatus may possibly be poor and the internal electronic elements possibly cannot operate normally and even may be damaged due to overheating.

Therefore, enhancing heat exchange efficiency, bringing internal waste heat to the outside, and preventing an electronic product from being damaged by overheating become important considerations in design of an electronic apparatus.

SUMMARY

To solve various conventional problems of the prior art, an electronic apparatus shell cover is provided. The electronic apparatus shell cover includes a body, a dust blocking screen, and a plurality of structural ribs. The body includes an opening and a plurality of assembling grooves. The opening penetrates through a first surface and a second surface of the body. The assembling grooves are on the second surface and adjacent to the opening. The dust blocking screen includes a screen surface and a plurality of assembling parts. The screen surface is mounted in the opening and coplanar with the first surface of the body. The assembling parts extend from the screen surface and are respectively disposed in the assembling grooves, so that the dust blocking screen and the body are fixedly connected. The structural ribs are connected to the first surface of the body and on the dust blocking screen.

In some embodiments, the electronic apparatus shell cover further includes a plurality of pads, and the pads are disposed on some of the structural ribs.

In some embodiments, the electronic apparatus shell cover further includes a plurality of cushions, and the cushions are disposed on one side of the first surface. More specifically, in some embodiments, a height of the cushions is greater than a total height of each of the structural ribs and the pads on the structural ribs.

In some embodiments, the electronic apparatus shell cover further includes a plurality of connection ribs. Each of the connection ribs is connected to at least two of the structural ribs. Furthermore, in some embodiments, the body, the structural ribs, and the connection ribs are formed integrally.

In some embodiments, the body and the structural ribs are formed integrally.

In some embodiments, the structural ribs are strip-shaped and arranged in parallel along the opening.

In some embodiments, the structural ribs are arranged irregularly.

In some embodiments, a height of the structural ribs located at two sides of the opening is greater than a height of the other structural ribs.

In view of the above, the dust blocking screen is coplanar with the first surface, to increase an internal accommodating space of the electronic apparatus shell cover or thin the body. Furthermore, the structural ribs can increase mechanical strength of the electronic apparatus shell cover, prevent the electronic apparatus shell cover from being deformed under a force, do not affect the internal accommodating space of the electronic apparatus shell cover, and can be used to support or raise the electronic apparatus shell cover. Thus, heat exchange efficiency is enhanced, ergonomics is satisfied, and a comfort degree of a user is enhanced.

DETAILED DESCRIPTION

Figure 1:
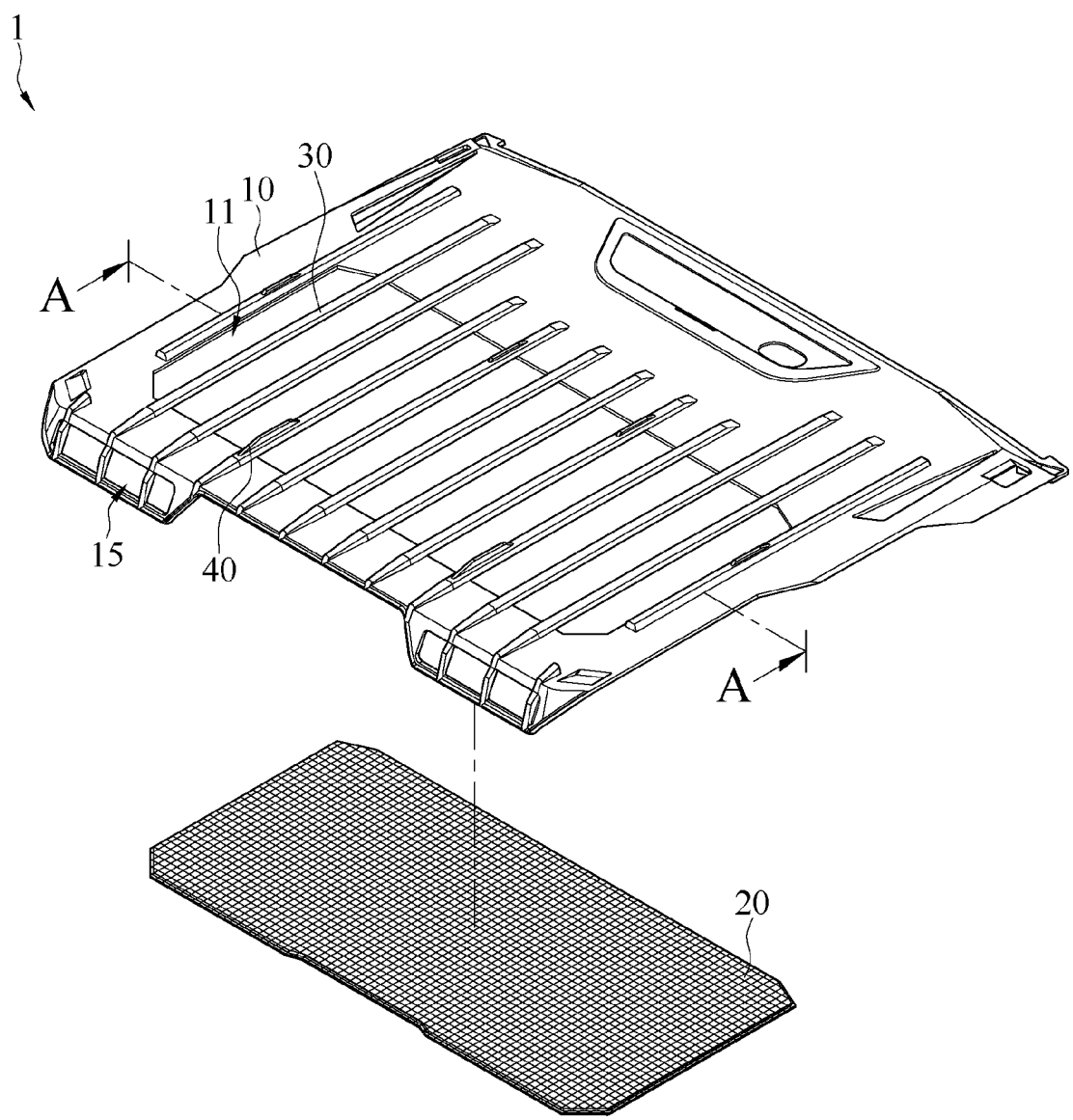
FIG. 1 is an exploded view of a first embodiment of an electronic apparatus shell cover.

For the purpose of clear description, widths of some elements and areas in the accompanying drawings are enlarged. In the whole specification, the same reference numerals represent the same elements. It should be understood that, when, for example, an element is called to be "on" or "connected to" another element, the element can be on or connected to the another element directly or through an intermediate element. On the contrary, when an element is called to be "on" or "connected to" another element directly, no intermediate element exists.

It should be understood that, although the terms "the first", "the second", "the third" and so on can be used to describe various elements, members, areas, or parts herein, the elements, members, areas, and/or parts are not limited by the terms. The terms are only used to distinguish one element, member, area, or part from another element, member, area, or part. Therefore, "a first element", "a first member", "a first area", or "a first part" discussed below can be called as a second element, a second member, a second area, or a second part without departing from the teachings of the present invention.

Furthermore, relative terms, such as "under" or "bottom" and "above" or "top", can be used to describe a relationship between one element and another element herein, as shown in the drawings. It should be understood that, the relative terms include different directions of an apparatus besides those shown in the drawings. For example, if an apparatus in an accompanying drawing is reversed, an element described to be at a "lower" side of another element will be positioned to be at an "upper" side of the another element. Therefore, an exemplary term "lower" can include an orientation "lower" or "upper" depending on a specific orientation of an accompanying drawing. Similarly, if an apparatus in an accompanying drawing is reversed, an element described to be "under" another element will be positioned to be "above" the another element. Therefore, an exemplary term "above" or "under" can include an orientation "above" or "under".

Figure 2:
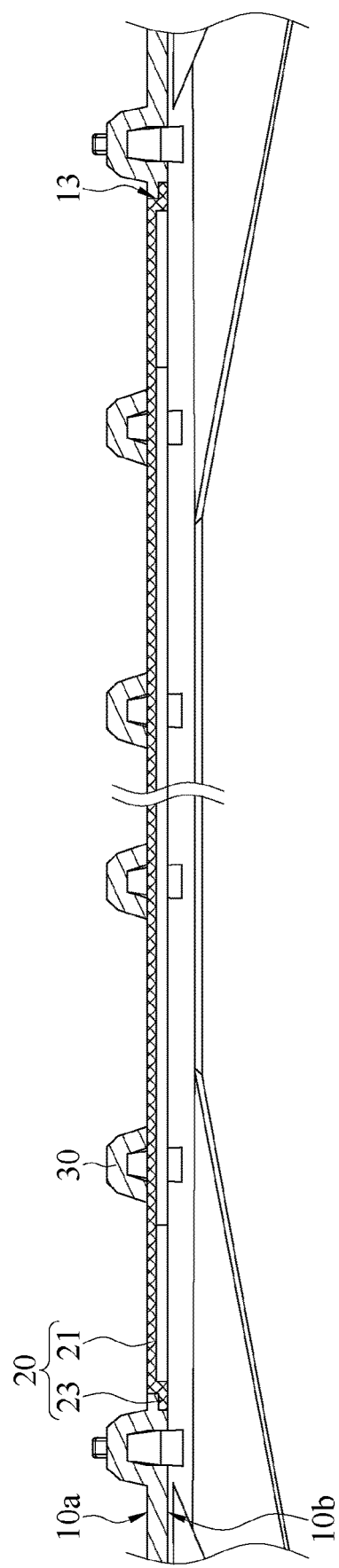
FIG. 2 is a schematic cross-sectional diagram taken along a line A-A in FIG. 1.

FIG. 1 is an exploded view of a first embodiment of an electronic apparatus shell cover. FIG. 2 is a schematic cross-sectional diagram taken along a line A-A in FIG. 1. As shown in FIG. 1 and FIG. 2, an electronic apparatus shell cover 1 includes a body 10, a dust blocking screen 20, and a plurality of structural ribs 30. Herein, for example, the electronic apparatus shell cover 1 is a lower cover of a notebook computer, and electronic device, i.e., a circuit board, which generates thermal energy, is usually mounted on the lower cover. However, it is only an example, and the present invention is not limited thereto. The electronic apparatus shell cover 1 may be any shell cover for loading electronic devices.

As shown in FIG. 1 and FIG. 2, the body 10 includes an opening 11 and a plurality of assembling grooves 13. The opening 11 penetrates through a first surface 10a and a second surface 10b of the body 10. Herein, for the purpose of easy understanding, the first surface 10a is an upper surface in FIG. 1 and FIG. 2 and the second surface 10b is a lower surface in FIG. 1 and FIG. 2. However, when the electronic apparatus shell cover is actually applied to an electronic apparatus, the first surface 10a may also be a lower surface of the electronic apparatus that has been assembled. The assembling grooves 13 are on the second surface 10b and adjacent to the opening 11. The assembling grooves 13 may be notches. Herein, the opening 11 provides a flow path through which cool air flows into the body 10, and the flow path serves as an air inlet channel for heat exchange. However, due to existence of the opening 11, mechanical strength of the body 10 is decreased.

The dust blocking screen 20 includes a screen surface 21 and a plurality of assembling parts 23. The screen surface 21 is mounted in the opening 11 and coplanar with the first surface 10a of the body 10. The assembling parts 23 extend from the screen surface 21 and are disposed in the assembling grooves 13 respectively. Herein, the assembling parts 23 may be outer edges protruding from the screen surface 21 and are not coplanar with the screen surface 21. In this way, the dust blocking screen 20 and the body 10 are fixedly connected. However, the concave and convex assembling modes of the assembling parts 23 and the assembling grooves 13 may also be exchanged.

In the conventional technology, the dust blocking screen 20 is usually planar and disposed on the second surface 10b by means of adhesion. However, a space for electronic devices mounting on the body 10 is limited. The assembling grooves 13 and the assembling parts 23 are assembled, so that the screen surface 21 and the first surface 10a are coplanar, and thus, an internal space of the body 10 is increased or the body 10 is further thinned.

Herein, the dust blocking screen 20 covers the opening 11, has meshes as inlets and outlets for air, and prevents external dust from entering the body 10, to prevent dust from being accumulated on channels between electronic elements mounted on the body 10 to affect heat dissipation effects. In addition, the dust blocking screen 20 is usually a metal screen, such as an iron screen and an aluminum screen. Thus, the dust blocking screen 20 can provide mechanical strength.

The structural ribs 30 are connected to the first surface 10a of the body 10, are on the dust blocking screen 20, and can further increase mechanical strength of the electronic apparatus shell cover 1, to prevent the electronic apparatus shell cover 1 from being deformed along the opening 11 under impact of an external force and prevent the dust blocking screen 20 from dropping off. Since the structural ribs 30 are connected to the first surface 10a, when the structural ribs 30 increase mechanical strength of the electronic apparatus shell cover 1, a space for elements mounted on the body 10 is not affected. Meanwhile, when the electronic apparatus shell cover 1 serves as a lower shell of a notebook computer, the structural ribs 30 can raise the first surface 10a, increase a distance between the first surface 10a and a plane on which the notebook computer is placed, satisfy ergonomics, and enhance a comfort degree of a user when the user uses the notebook computer, and can further enhance heat exchange efficiency of an electronic apparatus.

Referring to FIG. 1 again, the electronic apparatus shell cover 1 further includes a plurality of pads 40. The pads 40 may be disposed on some of the structural ribs 30. The pads 40 can enhance a friction force, to further maintain balance and stability of the electronic apparatus and avoid sliding and shaking. The pads 40 may be adjusted according to a position of a place on which the electronic apparatus is to be placed or a position to which the electronic apparatus is raised. A quantity, positions, shapes, or sizes of the pads 40 may be adjusted according to an actual application. FIG. 1 only shows an example, and the present invention is not limited thereto.

Figure 3:
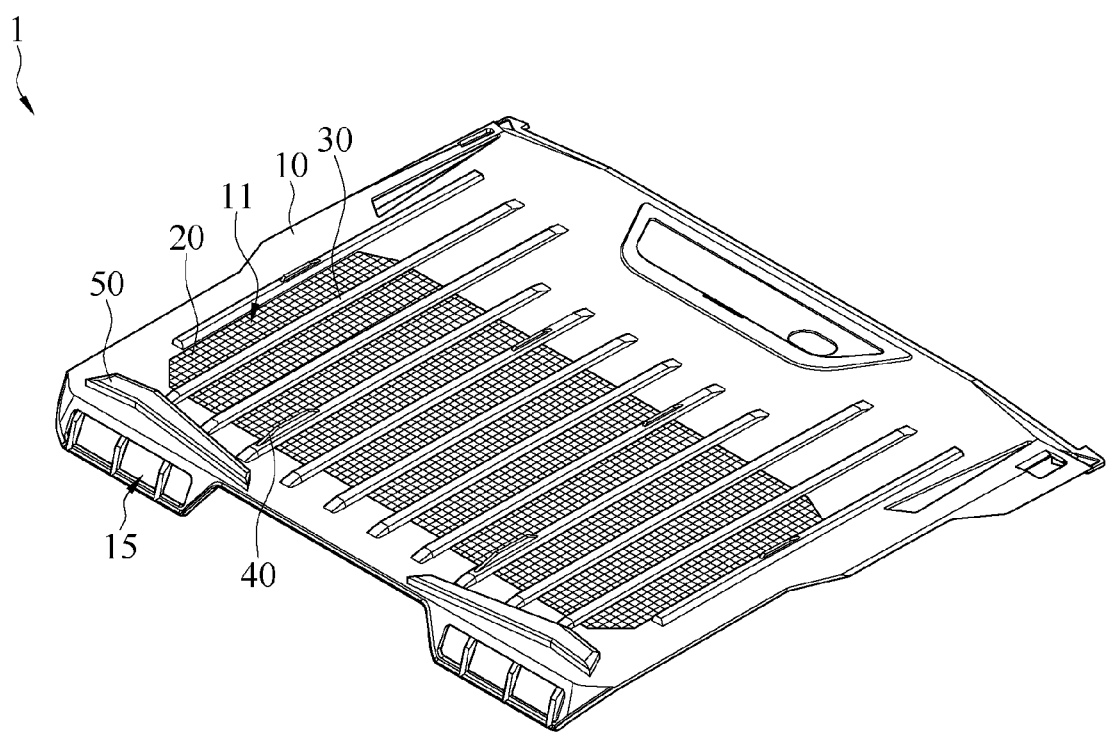
FIG. 3 is a schematic three-dimensional diagram of a second embodiment of an electronic apparatus shell cover.

FIG. 3 is a schematic three-dimensional diagram of a second embodiment of an electronic apparatus shell cover. As shown in FIG. 3, an electronic apparatus shell cover 1 further includes a plurality of cushions 50 that is disposed at one side of the first surface 10a. Herein, an air outlet channel 15 is further provided at one side of the body 10, the cushions 50 are adjacent to the air outlet channel 15, and the cushions 50 can enhance a height, to block hot air exhausted from the air outlet channel 15 and prevent the hot air entering the body 10 again through the opening 11. Furthermore, the height of the cushions 50 is greater than a total height of each structural rib 30 and the pads 40 on the structural ribs 30, so that the first surface 10a of the body 10 becomes an inclined surface by using the cushions 50, the structural ribs 30, and the pads 40 when the electronic apparatus is placed on a plane, to enhance heat dissipation effects and uniformity.

As shown in FIG. 1 and FIG. 3, the structural ribs 30 are strip-shaped and the structural ribs 30 are arranged in parallel along the opening 11. Herein, the body 10 and the structural ribs 30 may be formed integrally, that is, may be made in a same working procedure. In this embodiment, the structural ribs 30 may be flow paths for injection molding of the body 10, the flow paths are remained to be used as the structural ribs 30 directly after cooling and demolding, only a small amount of stubs need to be removed, the flow paths do not need to be detached, and therefore, procedures and material costs are greatly reduced. However, it is only an example, and the present invention is not limited thereto. For example, the structural rib 30 may also be made of a metal material and mounted on the body 10 by means of assembly, to further enhance mechanical strength of the electronic apparatus shell cover 1. The method for selecting a material or the manufacturing method can be adjusted according to actual design demand.

Figure 4:
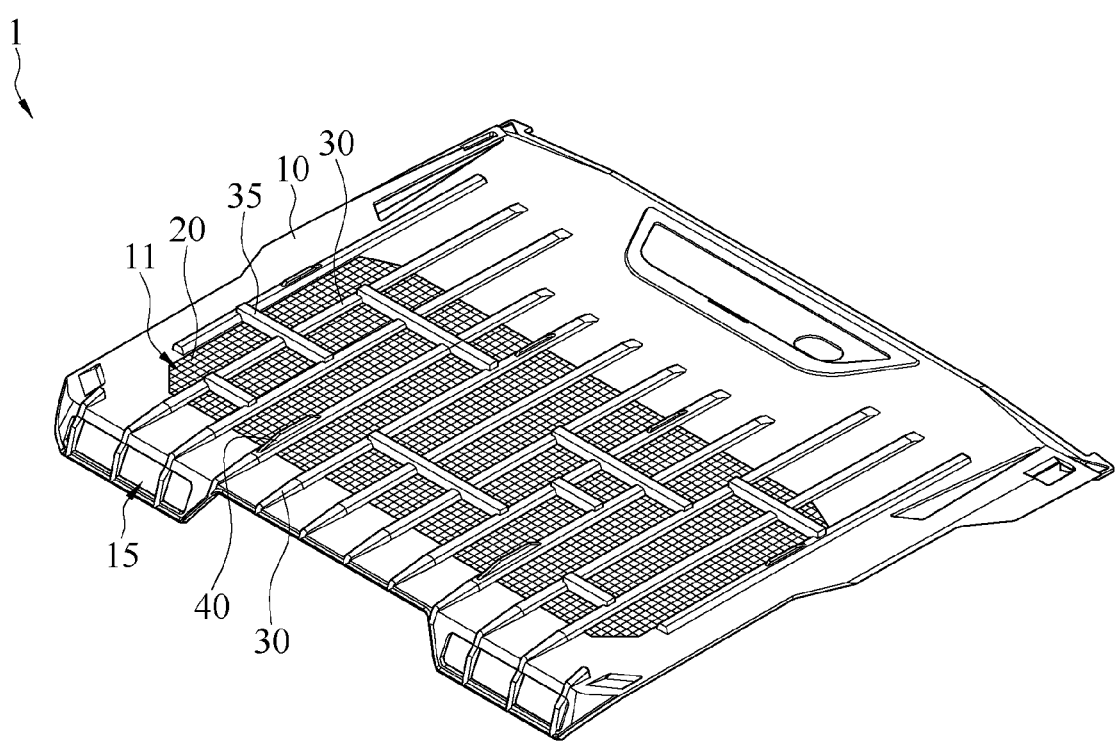
FIG. 4 is a schematic three-dimensional diagram of a third embodiment of the electronic apparatus shell cover.

FIG. 4 is a schematic three-dimensional diagram of a third embodiment of the electronic apparatus shell cover. As shown in FIG. 4, the electronic apparatus shell cover 1 further includes a plurality of connection ribs 35, and each of the connection ribs 35 is connected to at least two of the structural ribs 30. As shown in FIG. 4, the connection ribs 35 are connected to the structural ribs 30 in a transversal direction. However, actually, the connection ribs 35 can also be connected to the structural ribs 30 in an inclined direction. In some embodiments, the connection ribs 35, the body 10, and the structural ribs 30 may also be formed integrally. The connection ribs 35 may be original feeding paths for injection molding, and the feeding paths may be directly designed as the connection ribs 35 that are connected to the structural ribs 30. Thus, not only the mechanical strength of the body 10 is enhanced, but also waste of materials is reduced. However, likewise, it is only an example, and the present invention is not limited thereto. A method for selecting a material of the connection rib 35 or a method for manufacturing the connection rib 35 may be adjusted according to actual design demand.

Figure 5:
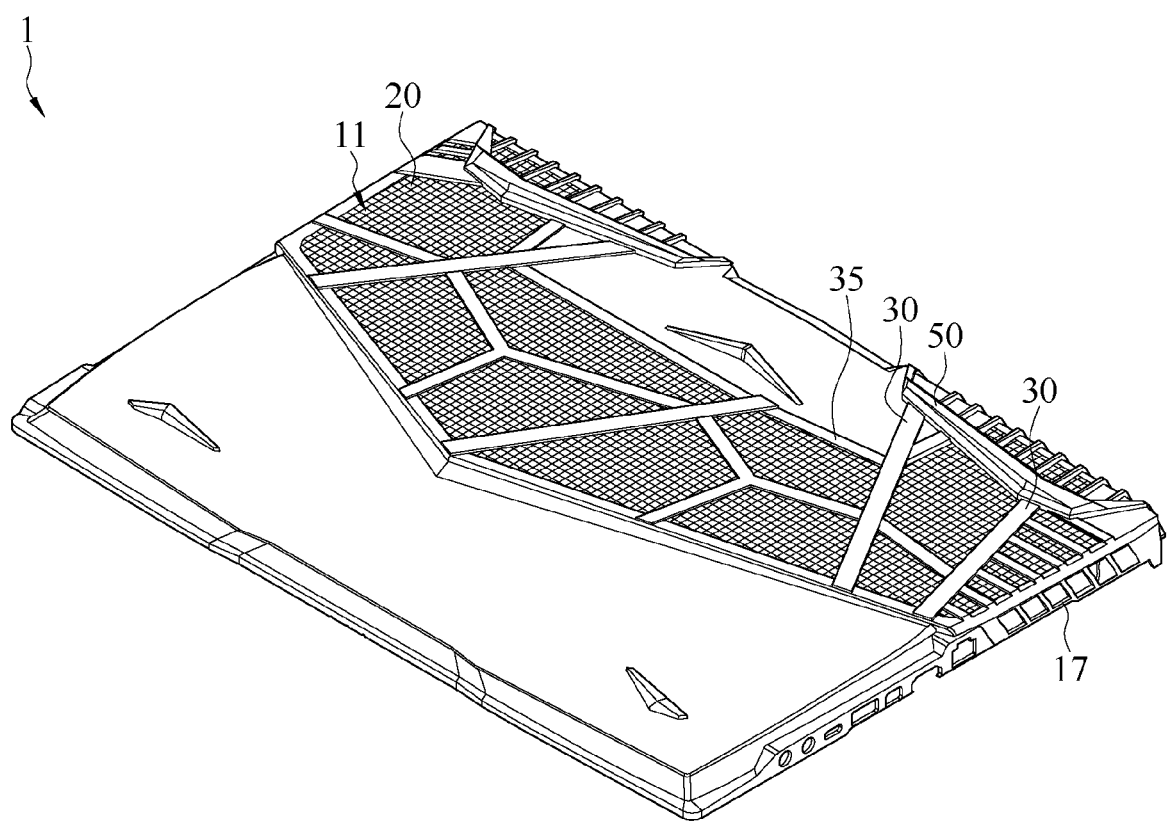
FIG. 5 is a schematic three-dimensional diagram of a fourth embodiment of the electronic apparatus shell cover.

FIG. 5 is a schematic three-dimensional diagram of a fourth embodiment of the electronic apparatus shell cover. As shown in FIG. 5, the structural ribs 30 are arranged irregularly. In addition, the structural ribs 30 may be connected further through the connection ribs 35 in irregular shapes. Thus, a unique appearance may be designed through arrangement of the structural ribs 30 and the connection ribs 35, to highlight design aesthetics, a brand and a trademark, or a special enterprise recognition feature.

Furthermore, as shown in FIG. 5, a height of the structural ribs 30 close to the two sides of the opening 11 may be greater than a height of the other structural ribs 30. This is mainly because some electronic apparatuses also have lateral air outlet channels 17 at sides thereof, and like providing the cushions 50 to block hot air exhausted by the lateral air outlet channels 17, the height of the structural ribs 30 at the two sides of the opening 11 may be increased to prevent hot air from entering the body 10 from the opening 11. Therefore, the heat exchange efficiency of an electronic apparatus may be enhanced. However, it is only an example, and the present invention is not limited thereto. The height adjustment of the structural ribs 30 and the setting of the lateral air outlet channels 17 may also be applied to the foregoing other embodiments.

In view of the above, an internal accommodating space of the electronic apparatus shell cover 1 is increased or the body 10 is thinned by making the screen surface 21 of the dust blocking screen 20 be coplanar with the first surface 10a. Furthermore, the structural ribs 30 are used to increase mechanical strength of the electronic apparatus shell cover 1 and prevent the electronic apparatus shell cover 1 from being deformed under a force. Meanwhile, the structural ribs 30 do not affect the internal accommodating space of the electronic apparatus shell cover 1, and can further prevent the dust blocking screen 20 from dropping off and support and raise the dust blocking screen 20, to enhance heat exchange efficiency and satisfy ergonomics to enhance comfort of a user.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electronic apparatus shell cover, comprising:
    a body, comprising an opening and a plurality of assembling grooves, wherein the opening penetrates through a first surface and a second surface of the body, and the assembling grooves are on the second surface and adjacent to the opening;
    a dust blocking screen, comprising a screen surface and a plurality of assembling parts, wherein the screen surface is mounted in the opening and coplanar with the first surface of the body, the assembling parts extend from the screen surface and are respectively disposed in the assembling grooves, so that the dust blocking screen and the body are fixedly connected;
    a plurality of structural ribs, connected to the first surface of the body and on the dust blocking screen; and
    a plurality of pads, disposed on some of the structural ribs.

2. The electronic apparatus shell cover according to claim 1, further comprising a plurality of cushions, wherein the cushions are disposed on one side of the first surface.

3. The electronic apparatus shell cover according to claim 2, wherein a height of the cushions is greater than a total height of each of the structural ribs and the pads on the structural ribs.

4. The electronic apparatus shell cover according to claim 1, further comprising a plurality of connection ribs, wherein each of the connection ribs is connected to at least two of the structural ribs.

5. The electronic apparatus shell cover according to claim 4, wherein the body, the structural ribs, and the connection ribs are formed integrally.

6. The electronic apparatus shell cover according to claim 1, wherein the body and the structural ribs are integrally formed.

7. The electronic apparatus shell cover according to claim 1, wherein the structural ribs are strip-shaped and arranged in parallel along the opening.

8. The electronic apparatus shell cover according to claim 1, wherein the structural ribs are arranged irregularly.

9. The electronic apparatus shell cover according to claim 7, wherein a height of the structural ribs located at two sides of the opening is greater than a height of the other structural ribs.

10. The electronic apparatus shell cover according to claim 8, wherein a height of the structural ribs located at two sides of the opening is greater than a height of the other structural ribs.

* * * * *